United States Patent
Delano et al.

(10) Patent No.: US 10,798,848 B2
(45) Date of Patent: Oct. 6, 2020

(54) PASSIVE THERMAL MANAGEMENT SYSTEM WITH PHASE CHANGE MATERIAL

(71) Applicant: Microsoft Technology Licensing, LLC, Redmond, WA (US)

(72) Inventors: Andrew Douglas Delano, Woodinville, WA (US); Gregory Allen Nielsen, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 391 days.

(21) Appl. No.: 15/099,446

(22) Filed: Apr. 14, 2016

(65) Prior Publication Data

US 2017/0303433 A1    Oct. 19, 2017

(51) Int. Cl.
| | |
|---|---|
| *H04B 1/3827* | (2015.01) |
| *H05K 7/20* | (2006.01) |
| *G06F 1/20* | (2006.01) |
| *H01L 23/427* | (2006.01) |
| *F28D 15/02* | (2006.01) |
| *F28D 15/04* | (2006.01) |

(Continued)

(52) U.S. Cl.
CPC ..... *H05K 7/20336* (2013.01); *F28D 15/0275* (2013.01); *F28D 15/04* (2013.01); *F28D 20/025* (2013.01); *F28D 20/026* (2013.01); *G06F 1/20* (2013.01); *G06F 1/206* (2013.01); *H01L 23/427* (2013.01); *H01L 23/4275* (2013.01); *H04B 1/3827* (2013.01); *F28D 2021/0028* (2013.01)

(58) Field of Classification Search
CPC ............................. F28D 20/025; F28D 20/026
See application file for complete search history.

(56) References Cited

U.S. PATENT DOCUMENTS

| | | | |
|---|---|---|---|
| 6,104,611 | A | 8/2000 | Glover et al. |
| 6,317,321 | B1 | 11/2001 | Fitch et al. |
| 6,997,241 | B2 | 2/2006 | Chou et al. |

(Continued)

FOREIGN PATENT DOCUMENTS

| | | | | |
|---|---|---|---|---|
| EP | 2495760 | | 9/2012 | |
| EP | 2495760 A2 | * | 9/2012 | ......... H01L 23/4275 |

OTHER PUBLICATIONS

"International Search Report & Written Opinion Issued in PCT Application No. PCT/US2017/026873", dated Jul. 11, 2017, 16 Pages.

(Continued)

*Primary Examiner* — Elizabeth J Martin
*Assistant Examiner* — Nael N Babaa
(74) *Attorney, Agent, or Firm* — Ray Quinney & Nebeker P.C.; John O. Carpenter

(57) ABSTRACT

Thermal management systems are described herein. A thermal management system includes components of a computing device. The computing device includes a heat generating component and a heat spreader physically connected to the heat generating component. The heat spreader includes a first surface and a second surface. The second surface is closer to the heat generating component than the first surface is to the heat generating component. The computing device also includes a layer of phase change material on at least a portion of the first surface, the second surface, or the first surface and the second surface of the heat spreader.

20 Claims, 8 Drawing Sheets

(51) Int. Cl.
*F28D 20/02* (2006.01)
*F28D 21/00* (2006.01)

(56) References Cited

U.S. PATENT DOCUMENTS

| | | | |
|---|---|---|---|
| 7,188,484 B2 | 3/2007 | Kim | |
| 7,646,606 B2 | 1/2010 | Rytka et al. | |
| 8,016,022 B2 | 9/2011 | Richason et al. | |
| 8,934,235 B2 | 1/2015 | Rubenstein et al. | |
| 2006/0191687 A1* | 8/2006 | Storm | E21B 36/00 166/302 |
| 2009/0223651 A1 | 9/2009 | Meyer, IV et al. | |
| 2010/0300654 A1* | 12/2010 | Edwards | F28D 15/0241 165/104.26 |
| 2012/0206880 A1* | 8/2012 | Andres | H01L 23/4275 361/700 |
| 2013/0294030 A1* | 11/2013 | Wang | H05K 7/20336 361/700 |
| 2015/0200368 A1* | 7/2015 | Lee | H01L 45/06 438/382 |
| 2015/0220122 A1* | 8/2015 | Rhee | G06F 1/203 361/679.52 |

OTHER PUBLICATIONS

Hodes, et al., "Transient Thermal Management of a Handset Using Phase Change Material (PCM)", In Journal of Electronic Packaging, vol. 124, Issue 4, Dec. 12, 2012, 2 pages.

Alawadhi, et al., "PCM Thermal Control Unit for Portable Electronic Devices: Experimental and Numerical Studies", In Journal of IEEE Transactions on Components and Packaging, Mar. 2003, pp. 116-125.

Vesligaj, et al., "Transient Thermal Management of Temperature Fluctuations during Time Varying Workloads on Portable Electronics", In Journal of IEEE Transactions on Components and Packaging Technologies, vol. 22, Issue 4, Dec. 1999, pp. 541-550.

Krishnan, et al., "A Novel Hybrid Heat Sink Using Phase Change Materials for Transient Thermal Management of Electronics", In Journal of IEEE Transactions on Components and Packaging Technologies, vol. 28, Issue 2, Jun. 2005, pp. 281-289.

Kandasamy, et al., "Transient Cooling of Electronics using Phase Change Material (PCM)-based Heat Sinks", In Journal of Applied Thermal Engineering, vol. 28, Issues 8-9, Jun. 24, 2007, pp. 1047-1057.

"Office Action Issued in European Patent Application No. 17719117.8", dated Aug. 13, 2019, 7 Pages.

* cited by examiner

PASSIVE THERMAL MANAGEMENT SYSTEM WITH PHASE CHANGE MATERIAL

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1:
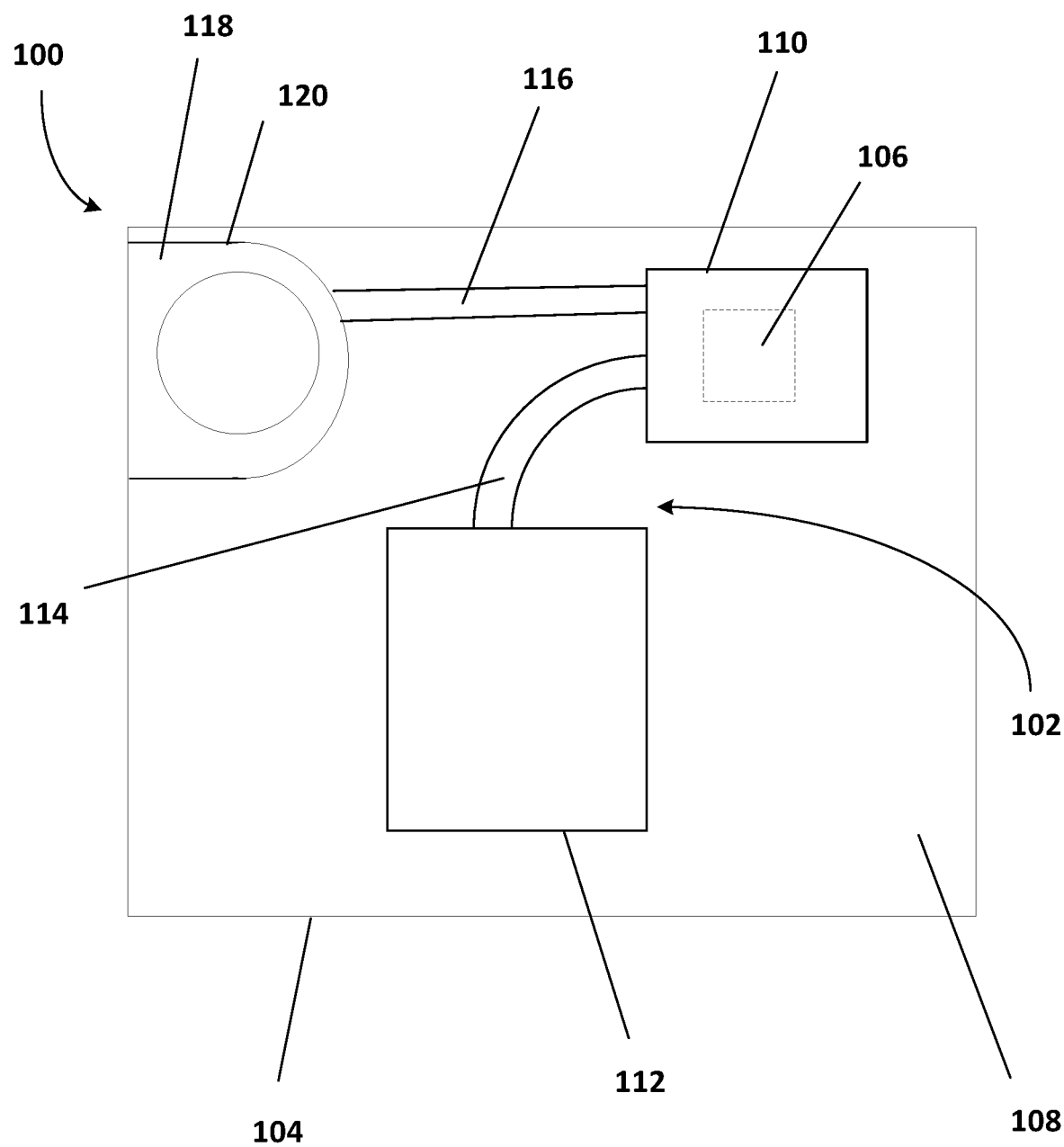
FIG. 1 depicts a top view of a computing device including an example of a thermal management system.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range. During operation, electronic devices dissipate power as heat that is to be removed from the device. Otherwise, the electronic device will get hotter and hotter until the electronic device is unable to perform efficiently. When overheating, electronic devices run slowly and dissipate power poorly. This can lead to eventual device failure and reduced service life.

As computing devices get smaller (e.g., thinner), thermal management becomes more of an issue. Heat may be dissipated from a computing device using forced and natural convection, conduction, and radiation as a way of cooling the computing device as a whole and a processor operating within the computing device. Depending on the thickness of the device, there may not be sufficient room within the device for active thermal management components such as, for example, fans. Passive thermal management may thus be relied on to cool the device. For example, buoyancy driven convection (i.e., natural convection) and radiation to the surroundings may be relied upon to cool the device.

Assuming the size of a computing device, and thus a surface area for radiative heat transfer, are fixed, and a maximum temperature of an outside surface of the computing device is fixed by user comfort and safety limits, optimized heat rejection from the computing device, and thus a maximum steady state power level for the computing device, are provided when the maximum temperature of the outside surface of the computing device is constantly maintained.

Some computing devices benefit from the ability to handle power levels higher than the maximum steady state power level for a duration of time. The duration of time the computing device may operate at a power level greater than the maximum steady state power level is determined based on the ability of the computing device to store heat. This is a function of both the thermal capacitance of the computing device and low thermal resistance access to the thermal capacitance. Optimized transient response is provided when the computing device changes temperature uniformly in both time and space, thus enabling instantaneous access to all available thermal capacitance. A time to reach the maximum temperature of the outside surface of the computing device may be increased by increasing the thermal capacitance within a computing device.

Disclosed herein are apparatuses, systems, and methods for providing an isothermal surface of a computing device to maximize passive heat transfer (e.g., in the presence of a buoyancy driven flow) from the computing device, while also providing increased thermal capacitance to thermally handle spikes in power levels of the computing device. The improved passive heat transfer from the electronic device may be provided by a constant temperature process (e.g., condensation of a pure fluid such as water) on or near the surface. For example, a phase change device (e.g., a vapor chamber) that is thermally connected to a heat generating component within the computing device may be positioned adjacent to the surface. A layer of phase change material such as, for example, a refined paraffin wax including a binder is disposed on at least one surface of the phase change device to increase thermal capacitance within the computing device and thus increase an amount of time the computing device may run at a greater than maximum steady state power.

As an example, the improved heat dissipation from a computing device may be implemented by providing a heat spreader physically connected to a heat generating component. The heat spreader includes a first surface and a second surface. The second surface is closer to the heat generating component than the first surface. A layer of phase change material is provided on at least a portion of the heat spreader.

Such heat dissipation apparatuses or systems have several potential end-uses or applications, including any electronic device having a passive or an active cooling component (e.g., fan). For example, the heat dissipation apparatus may be incorporated into personal computers, server computers, tablet or other handheld computing devices, laptop or mobile computers, gaming devices, communications devices such as mobile phones, multiprocessor systems, microprocessor-based systems, set top boxes, programmable consumer electronics, network PCs, minicomputers, mainframe computers, or audio or video media players. In certain examples, the heat dissipation apparatus may be incorporated within a wearable electronic device, where the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, improved heat dissipation may be provided for the electronic device. With the improved heat dissipation feature, a more powerful microprocessor may be installed for the electronic device, a thinner electronic device may be designed, a higher processing speed may be provided, the electronic device may be operated at a higher power for a longer period of time, or any combination thereof may be provided when compared to a similar electronic device without one or more of the improved heat dissipation features. In other words, the heat dissipation features described herein may provide improved thermal management for an electronic device such as a mobile phone, tablet computer, or laptop computer.

FIG. 1 shows a top view of a computing device 100 including an example of a thermal management system 102. The computing device 100 may be any number of computing devices including, for example, a personal computer, a server computer, a tablet or other handheld computing device, a laptop or mobile computer, a communications device such as a mobile phone, a multiprocessor system, a microprocessor-based system, a set top box, a programmable consumer electronic device, a network PC, a minicomputer, a mainframe computer, or an audio and/or video media player.

The computing device 100 includes a housing 104 that supports at least the thermal management system 102 and a heat generating component 106. The heat generating component 106 may be any number of electrically powered devices including, for example, a processor, memory, a power supply, a graphics card, a hard drive, or another electrically powered device. The heat generating component 106 (e.g., a processor) may be supported by the housing 104 via, for example, a printed circuit board (PCB) 108 attached to and/or supported by the housing 104. The processor 106 is in communication with other electrical devices or components of the computing device 100 via the PCB 108, for example. The computing device 100 may include a number of components not shown in FIG. 1 (e.g., a hard drive, a power supply, connectors).

The processor 106 is electromagnetically shielded by a shield 110. The shield 110 may be any number of shapes including, for example, rectangular and may be made of any number of materials including, for example, copper. The shield 110 may reduce the coupling of electromagnetic fields and radio waves. The amount of reduction depends on, for example, the material used, thickness of the material used, and a size of a shielded volume.

The thermal management system 102 includes a passive thermal module 112 (e.g., a heat spreader such as a vapor chamber) and at least one phase change device 114. In the example shown in FIG. 1, the thermal management system 102 includes a first phase change device 114 and a second phase change device 116. First ends of the first phase change device 114 and the second phase change device 116, respectively, are in physical contact with and/or are adjacent to the processor 106. In one example, the first ends of the first phase change device 114 and the second phase change 116 device are physically attached to a surface of the processor 106 via a layer of thermal adhesive.

The first phase change device 114 extends away from the processor 106, through an opening in the shield 110, to the heat spreader 112 at a second end of the first phase change device 114. The first phase change device 114 moves heat away from the processor 106 and towards the heat spreader 112. The second phase change device 116 extends away from the processor 106, through an opening in the shield 110, to a fan 118 (e.g., a fan housing 120) at a second end of the second phase change device 116. One or more components of the thermal management system 102 are attached to the housing 104 in any number of ways including, for example, using one or more connectors (e.g., screws, flanges, tabs).

The first phase change device 114 and the second phase change device 116 may each be a heat pipe, a vapor chamber, or a combination thereof. The first phase change device 114 and the second phase change device 116 may be made of any number of materials including, for example, copper, aluminum, titanium, another thermally conducting material, or any combination thereof. The internal structure of a heat pipe or vapor chamber is important for phase change performance. Features that affect phase change performance include vapor space and capillary features. The vapor space is a path for evaporated working fluid to travel to a condenser, and the capillary features are a pathway for condensed working fluid to return to an evaporator.

The second end of the first phase change device 114 is physically attached to the heat spreader 112. The second end of the first phase change device 114 may be physically attached to the heat spreader 112 in any number of ways including, for example, with an adhesive (e.g., a thermal adhesive), with solder, by a press fit, with one or more connectors (e.g., screws, nut/bolt combinations), or any combination thereof. In one example, the first phase change device 114 and the heat spreader 112 are manufactured as a single component (e.g., 3D printed as a single component). In one example, the heat spreader 112 is an extension of the first phase change device 114, in that the vapor space of the first phase change device 114 extends into the heat spreader 112. In another example, the heat spreader 112 is a solid piece of thermally conductive material. For example, the heat spreader 112 may be a solid piece of copper, aluminum, or another thermally conductive material.

The heat spreader 112 may be any number of dimensions. The dimensions of the heat spreader 112 may be determined by the size of the device in which the heat spreader 112 is used. The greater a surface area of the heat spreader 112, the closer a temperature distribution of a surface adjacent to the heat spreader (e.g., a surface of a housing of the computing device 100) is to isothermal. The heat spreader 112 may aid in the prevention of hot spots and/or provide for more uniform temperatures within the computing device 100, as, in combination with the first phase change device 114, the heat spreader 112 helps move and keep heat away from the heat generating processor 106.

In the example shown in FIG. 1, the second end of the second phase change device 116 is physically attached to the fan housing 120. The second end of the second phase change device 116 may be physically attached to the fan housing 120 in any number of ways including, for example, with an adhesive (e.g., a thermal adhesive), with solder, by a press fit (e.g., a friction fit between the second phase change device 116 and a recess in the fan housing 120), with one or more connectors (e.g., screws, nut/bolt combinations), or any combination thereof. In one example, the second phase change device 116 and the fan housing 120 are manufactured as a single component (e.g., 3D printed as a single component). The fan housing 120 may be made of any number of thermally conductive materials including, for example, copper, aluminum, or another thermally conductive material. In one example, the fan housing 120 is made of plastic.

The second phase change device 116 moves heat away from the processor 106 and towards the fan 118. The fan 118 actively cools the second phase change device 116, moving heat out of the computing device 100 via vents in the housing 104 of the computing device 100. In other examples, the computing device 100 includes additional fans, and additional phase change devices extend from the processor 106 to housings of the additional fans, respectively.

The computing device 100 and/or the thermal management system 102 may include more and/or different components. In one example, the thermal management system 102 also includes one or more heat sinks. For example, the heat spreader 112, the first phase change device 114, the second phase change device 116, another device, or any combination thereof may include a plurality of fins extending away from the heat spreader 112, the first phase change device 114, the second phase change device 116, the other device, or the combination thereof. The plurality of fins may be made of any number of thermally conductive materials including, for example, copper, aluminum, or titanium. The plurality of fins may be physically connected to the heat spreader 112, the first phase change device 114, or the second phase change device 116, for example, via a layer of thermal adhesive (e.g., thermal paste).

To better thermally handle pulses of higher than steady state operating power within the computing device 100, layers of phase change material may be applied to one or more surfaces of the components of the thermal management system 102 (e.g., the heat spreader 112, the first phase change device 114, the second phase change device 116, and the fan housing 120) to increase thermal capacitance within the computing device. Due to size (e.g., thickness) constraints, computing devices may not include active thermal management components such as, for example, fans. For such computing devices, passive heat transfer from the computing device may be optimized by constantly maintaining a maximum temperature of an outer surface of the computing device. This may be approximated or achieved with the use of a larger heat spreader (e.g., vapor chamber) compared to the heat spreader 112 shown in FIG. 1, positioned adjacent to a surface of a housing of the computing device. FIGS. 2-6 show computing devices including examples of passive thermal management systems.

Figure 2:
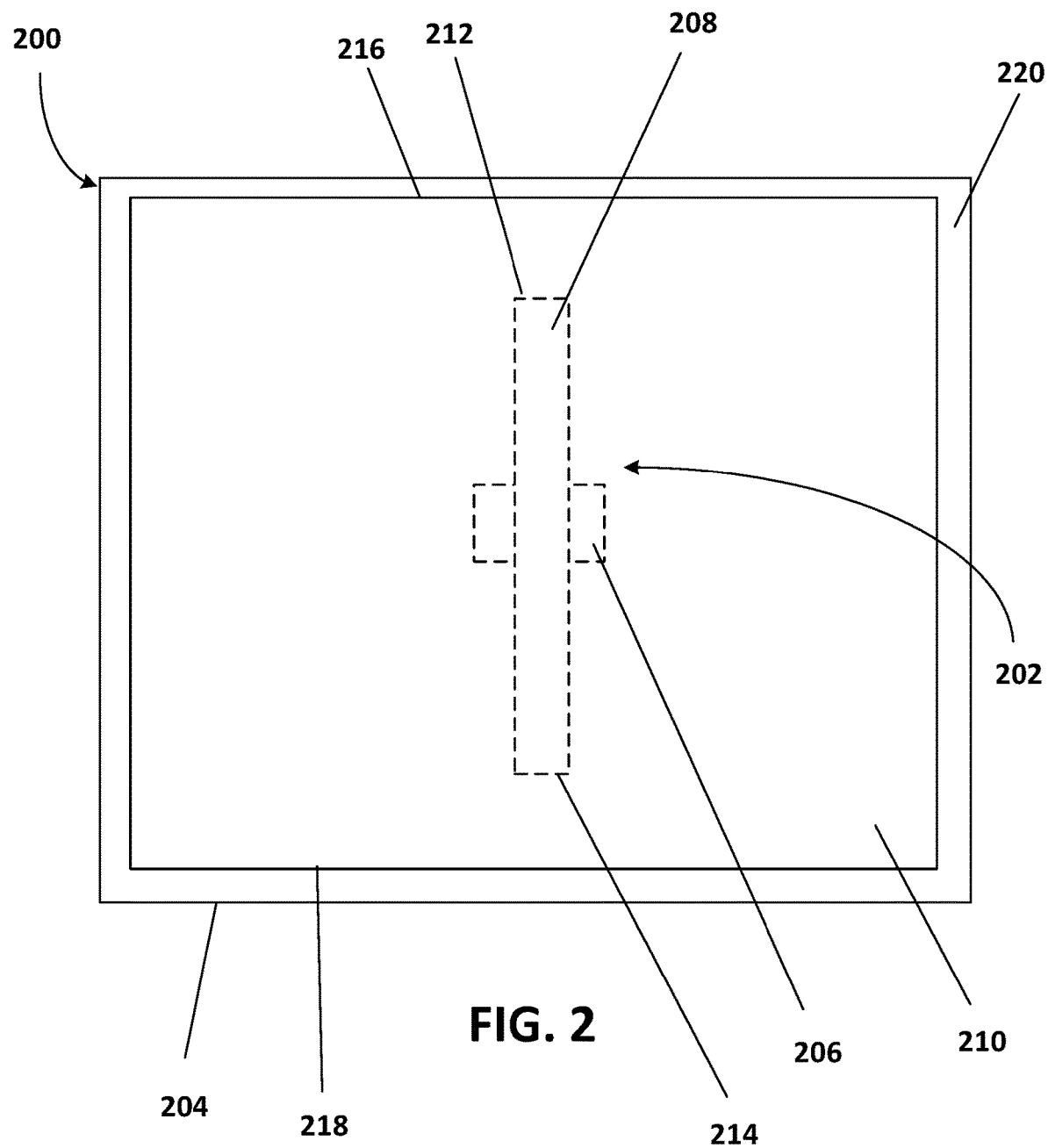
FIG. 2 depicts a top view of a portion of a computing device including an example of a passive thermal management system.

FIG. 2 depicts a top view of a portion of a computing device 200 including an example of a passive thermal management system 202 supported by a housing 204. In FIG. 2, a portion of the housing 204 is removed, and an interior of the housing 204 (e.g., largest cross-section of the housing) is shown. The computing device 200 also includes a heat generating component 206 supported by (e.g., within) the housing 204. The heat generating component 206 may be any number of electrically powered devices including, for example, a processor, memory, a power supply, a graphics card, a hard drive, or another electrically powered device. The heat generating component 206 (e.g., a processor) may be supported by the housing 204 via, for example, a printed circuit board (PCB) (see FIG. 3) attached to and/or supported by the housing 204. The processor 206 is in communication with other electrical devices or components of the computing device 200 via the PCB, for example. The computing device 200 may include a number of components not shown in FIG. 2 (e.g., a hard drive, a power supply, connectors).

The passive thermal management system 202 includes a first phase change device 208 and a second phase change device 210. In the example shown in FIG. 2, the first phase change device 208 is a heat pipe, and the second phase change device 210 is a vapor chamber. The heat pipe 208 abuts or is adjacent to the processor 206, and the vapor chamber 210 abuts or is adjacent to the heat pipe 208.

The heat pipe 208 helps spread heat across the vapor chamber 210 and provides that the vapor chamber 210 functions correctly during periods of high thermal load. If too much heat is applied to a vapor chamber, vapor pressures within the vapor chamber may not allow a working fluid (e.g., water) within the vapor chamber 210 to return to a heat source (e.g., the processor 206; an evaporator).

The heat pipe 208 may be any number of sizes and/or shapes. For example, as shown in FIG. 2, the heat pipe 208 may be a rectangular flat heat pipe (e.g., with rounded sides and/or corners). In other examples, the heat pipe 208 is a circular flat heat pipe or is a cylindrical heat pipe. The thickness of the heat pipe 208 may be defined based on the thickness of the computing device 200 in which the passive thermal management system 202 is installed.

The heat pipe 208 shown in FIG. 2 extends longitudinally away from the processor 206 and towards opposite sides of the vapor chamber 210. For example, the heat pipe 208 includes a first end 212 and a second end 214, and the vapor chamber 210 includes a first side 216 and a second side 218. The heat pipe 208 extends longitudinally away from the processor 206 such that the first end 212 of the heat pipe 208 is closer to the first side 216 of the vapor chamber 210 than the second side 218 of the vapor chamber 210, and the second end 214 of the heat pipe 208 is closer to the second side 218 of the vapor chamber 210 than the first side 216 of the vapor chamber 210. In one example, the heat pipe 208 extends longitudinally away from the processor 206 such that the first end 212 and the second end 214 of the heat pipe 208 are aligned with or extend beyond the first side 216 and the second side 218 of the vapor chamber 210, respectively. Other orientations of the heat pipe 208 and/or directions of longitudinal extension of the heat pipe 208 may be provided.

The vapor chamber 210 may be any number of sizes and/or shapes. For example, as shown in FIG. 2, the vapor chamber 210 may be a rectangular flat vapor chamber (e.g., with rounder corners). The thickness of the vapor chamber 210 may be defined based on the thickness of the computing device 200 in which the passive thermal management system 202 is installed. A largest outer surface area of the vapor chamber 210 may approximately match a surface area of an inner surface 220 of the housing 204. The housing 204 may include a display housing and a chassis (see FIG. 3), and the inner surface 220 of the housing 204 may, for example, by formed by an outer surface of the display housing or an inner surface of the chassis. In one example, the vapor chamber is sized such that the largest outer surface area of the vapor chamber 210 is as large as will fit inside the housing 204. In other examples, the vapor chamber is smaller (see FIG. 1).

A layer of phase change material is disposed on at least a portion of an outer surface of the vapor chamber 210 (e.g., a top, or a top and a bottom of the vapor chamber 210). The phase change material may be any number of materials. For example, the phase change material is a refined paraffin wax that includes a binder. The binder eliminates flow after phase change. Different paraffin waxes may be used for the layer of phase change material applied to the outer surface of the vapor chamber 210 based on the particular computing device and, more specifically, temperatures produced within the particular computing device. Different paraffin waxes have different melt peaks, different densities, and different latent heats of fusion. The paraffin wax used, for example, may be selected such that the melt peak of the paraffin wax matches a temperature at the vapor chamber 210 during operation of the computing device 200 (e.g., at maximum steady state power level and/or at a power level greater than the maximum steady state power level). When a melting point is reached, the paraffin wax begins to store heat during phase change. Depending on the amount of phase change material applied to the vapor chamber 210, for example, and the phase change material used, sufficient cooling of the computing device 200 (e.g., without reducing power) may be provided for 100 or more additional seconds, for example, while the computing device 200 operates above steady state power. With increased volume of the layer of phase change material, the amount of additional time the computing device 200, for example, may be sufficiently cooled during higher than steady state power operation also increases.

Figure 3:
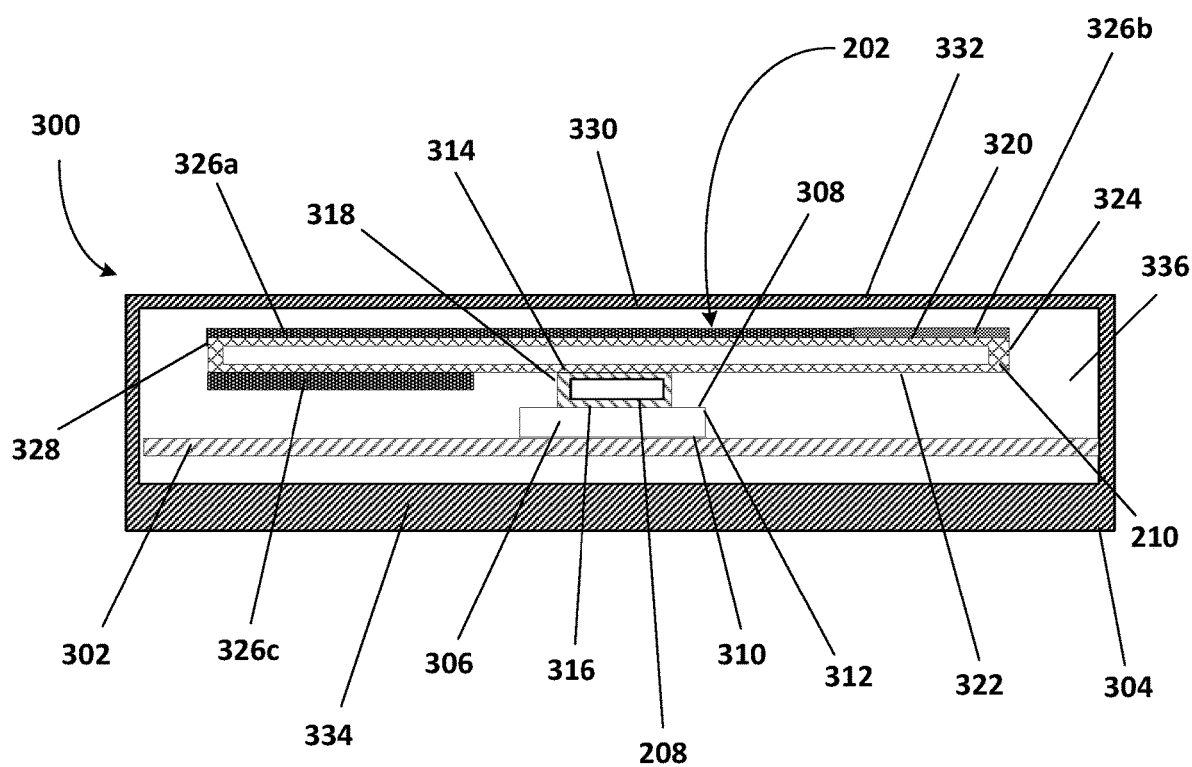
FIG. 3 depicts a cross section of a computing device including the passive thermal management system of FIG. 2.

FIG. 3 depicts a cross section of a computing device 300 including the passive thermal management system 202 of FIG. 2. The computing device 300 also includes a PCB 302 supported within a housing 304. The PCB 302 may be supported by and/or fixed to the housing 304 in any number of ways including, for example, with tabs, flanges, connectors, an adhesive, or any combination thereof. The PCB 302 supports and is electrically connected to a heat generating component 306 (e.g., a processor).

Heat is moved away from the processor 306, for example, and out of the computing device 300 with the passive thermal management system 202. The processor 306 includes a first side 308 (e.g., a top or a first surface), a second side 310 (e.g., a bottom or a second surface), and at least one third side 312 that extends from the first side 308 to the second side 310. The second side 310 of the processor 306 abuts or is adjacent to the PCB 302. The first side 308 of the processor 306 abuts or is adjacent to the heat pipe 208 of the passive thermal management system 202.

The heat pipe 208 includes a first side 314 (e.g., a top or a first surface), a second side 316 (e.g., a bottom or a second surface), and at least one third side 318 that extends from the first side 314 to the second side 316. The second side 316 of the heat pipe 208 abuts or is adjacent to the first side 308 of the processor 306. The second side 316 of the heat pipe 208 may be adjacent to the first side 308 of the processor 306 in that one or more layers of additional material may be disposed between the second side 316 of the heat pipe 208 and the first side 308 of the processor 306. For example, one or more layers of thermal adhesive may be disposed between the second side 316 of the heat pipe 208 and the first side 308 of the processor 306. The first side 314 of the heat pipe 208 abuts or is adjacent to the vapor chamber 210 of the passive thermal management system 202.

The vapor chamber 210 includes a first side 320 (e.g., a top or a first surface), a second side 322 (e.g., a bottom or a second surface), and at least one third side 324 that extends from the first side 320 to the second side 322. The second side 322 of the vapor chamber 210 abuts or is adjacent to the first side 314 of the heat pipe 208. The second side 322 of the vapor chamber 210 may be adjacent to the first side 314 of the heat pipe 208 in that one or more layers of additional material may be disposed between the second side 322 of the vapor chamber 210 and the first side 314 of the heat pipe 208. For example, one or more layers of thermal adhesive may be disposed between the second side 322 of the vapor chamber 210 and the first side 314 of the heat pipe 208. The heat pipe 208 and/or the vapor chamber 210 may be physically attached to the PCB 302, the housing 304, another surface within the computing device 300, or any combination thereof in any number of ways including, for example, with tabs, flanges, connectors, an adhesive, or any combination thereof. The inclusion and positioning of the heat pipe 208 in the passive thermal management system 202 allows a thinner vapor chamber 210 to be used compared to a thermal management system not including the heat pipe 208 (e.g., see FIGS. 4 and 5). The heat pipe 208, which is in physical contact with the heat generating component (e.g., the processor 306) acts as a heat flux transformer, transforming high heat flux into low heat flux with low resistance (e.g., similar to a heat manifold).

One or more layers of phase change material 326 are positioned on at least a portion of an outer surface 328 of the vapor chamber 210. In the example shown in FIG. 3, three separate layers of phase change material 326 (e.g., a first layer of phase change material 326a, a second layer of phase change material 326b, and a third layer of phase change material 326c) are disposed on respective portions of the outer surface 326 of the vapor chamber 210. More, fewer, or different layers of phase change material may be applied to the vapor chamber 210 or other components of the computing device 300, for example.

The first layer of phase change material 326a is disposed on the first side 320 of the vapor chamber 210. The first layer of phase change material 326a may extend across the entire vapor chamber 210 or less than the entire vapor chamber 210 in one direction (e.g., into the page in FIG. 3). The first layer of phase change material 326a is made of a first material having a first melt peak, a first density, and a first latent heat of fusion (e.g., first properties). The first material may be selected based on the first properties and temperatures that are produced within the computing device 300. In one example, the first material is a refined paraffin wax with a binder. The greater the volume of the first layer of phase change material 326a, the more thermal capacitance the first layer of phase change material 326a adds to the computing device 300. If the surface area is constrained by the size of the vapor chamber 210, for example, the thickness of the first layer of phase change material 326a may be increased to provide additional thermal capacitance to the computing device 300.

The second layer of phase change material 326b is disposed on the first side 320 of the vapor chamber 210. The second layer of phase change material 326b may extend across the entire vapor chamber 210 or less than the entire vapor chamber 210 in one direction (e.g., into the page in FIG. 3). The second layer of phase change material 326b is made of a second material having a second melt peak, a second density, and a second latent heat of fusion (e.g., second properties). The second material may be selected based on the second properties and temperatures that are produced within the computing device 300. For example, different materials may be disposed on different portions of the vapor chamber 210 based on contours of a thermal profile within the computing device 300 to provide an isothermal surface on the housing 304. Any number of separate layers of phase change material with different sizes, shapes, materials, or any combination thereof may be provided based on the contours of the thermal profile within the computing device 300. The second material may be a refined paraffin wax with a binder. The greater the volume of the second layer of phase change material 326b, the more thermal capacitance the second layer of phase change material 326b adds to the computing device 300. If the surface area is constrained by the size of the vapor chamber 210, for example, the thickness of the second layer of phase change material 326b may be increased to provide additional thermal capacitance to the computing device 300.

The third layer of phase change material 326c is disposed on the second side 322 of the vapor chamber 210. The third layer of phase change material 326c may extend across the entire vapor chamber 210 or less than the entire vapor chamber 210 in one direction (e.g., into the page in FIG. 3). The third layer of phase change material 326c is made of the first material having the first properties. The third layer of phase change material 326c has a greater thickness than the first layer of phase change material 326a and the second layer of phase change material 326b. In one example, the third layer of phase change material 326c is made of a third material, which is different than the first material and the second material.

Other configurations may be provided. For example, a single layer of phase change material may cover all of the outer surface 328 of the vapor chamber 210. In another example, a single layer of phase change material may cover all of one side of the vapor chamber 210 (e.g., all of the first side 320, all of the second side 322, or all of the at least one third side 324 of the vapor chamber 210). In yet another example, a single layer of phase change material may cover less than all of one side of the vapor chamber 210. In other examples, one or more additional layers of phase change material are disposed on other components within the computing device 300 (e.g., the heat pipe 208 and/or the PCB 302).

The first side 320 of the vapor chamber 210 may be at a distance from an inner surface 330 of the housing 304. The first side 320 of the vapor chamber 210 being at a distance from the inner surface 330 of the housing 304, and the resultant air gap between the vapor chamber 210 and the housing 304, may further aid in heat spreading and thus providing the isothermal surface. In an alternative example, the first side 320 of the vapor chamber 210 is physically connected to the inner surface 330 of the housing 304 via a layer of phase change material.

The housing 304 includes a chassis 332 and a display housing 334. The chassis 332 and the display housing 334 are physically connected together to form an inner volume 336 in which components of the computing device 300 (e.g., the PCB 302, the processor 306, and the passive thermal management system 202) are housed. In one example, the chassis 332 and the display housing 334 are portions of a single part. The display housing 334 houses components for the display. The display components are electrically connected to the processor 306 via the PCB 302. Depending on the computing device, the isothermal surface (or approximately isothermal surface) to be cooled may be a surface on the chassis 332 or a surface on the display housing 334. In other words, the vapor chamber 210 and at least the first layer of phase change material 326a may be adjacent to the inner surface 330 of the housing 304 formed by the chassis 332 or the display housing 334. In one example, a layer of phase change material is disposed on the inner surface 330 (e.g., formed by the chassis 332 and/or the display housing 334). The first side 320 of the vapor chamber 210 may be opposite to and/or parallel with the inner surface 330 of the housing 304.

The computing device 300 may also include active thermal management components such as, for example, one or more fans. The one or more fans aid the passive thermal management system 202 with removal of heat generated by the processor 306 from the computing device 300. A thermal dock may also be used to help the passive thermal management system 202 with heat removal. The computing device 300, for example, may be docked with the thermal dock in that an outer surface (e.g., the isothermal surface) of the computing device is in physically contact with a Peltier device or another heat transfer device of the thermal dock.

Figure 4:
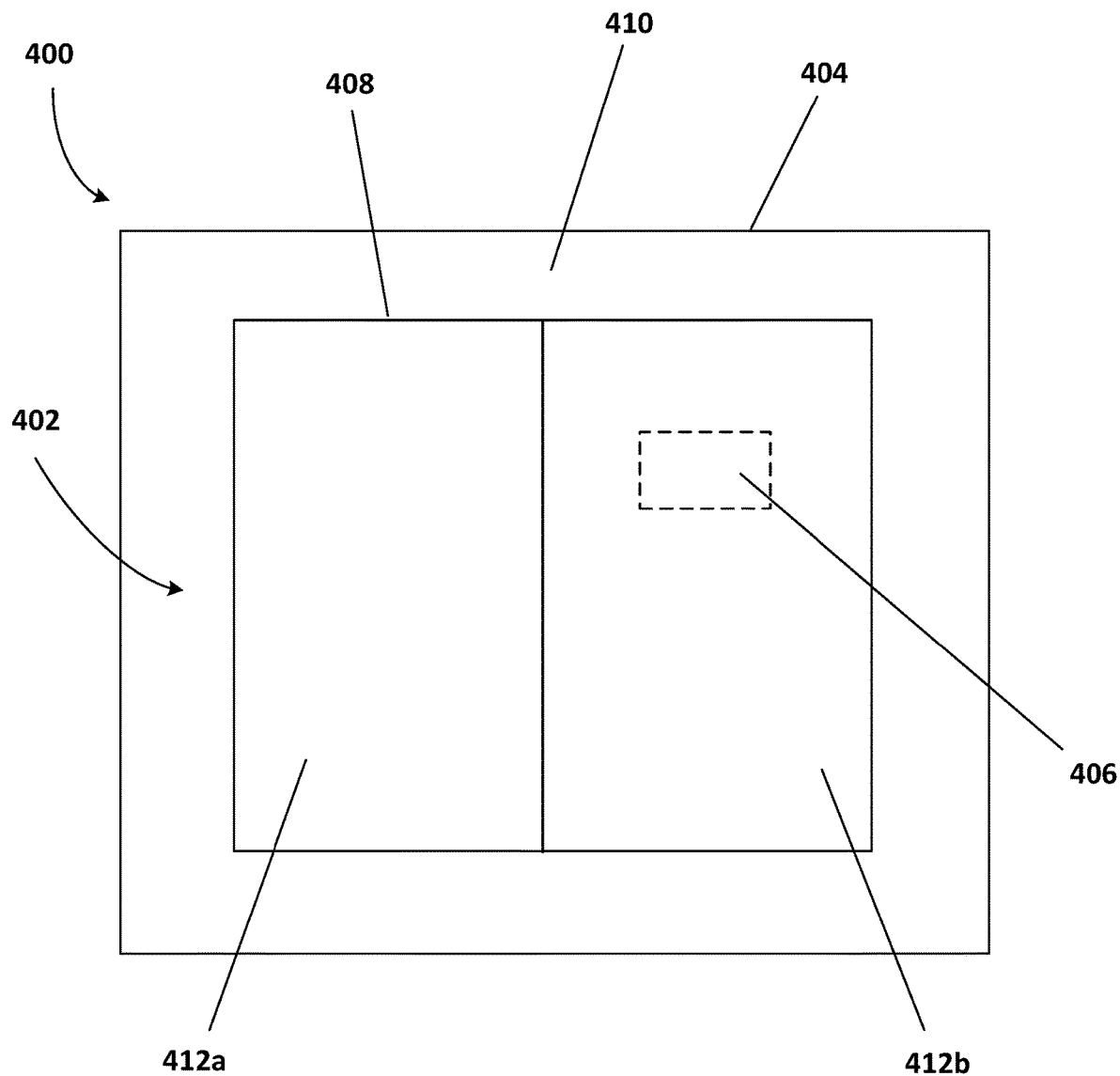
FIG. 4 depicts a top view of a portion of a computing device including another example of a passive thermal management system.

FIG. 4 depicts a top view of a portion of a computing device 400 including another example of a passive thermal management system 402, which is supported by a housing 404. In FIG. 4, a portion of the housing 404 is removed, and an interior of the housing 404 (e.g., largest cross-section of the housing) is shown. The computing device 400 also includes a heat generating component 406 (e.g., a processor) supported within the housing 404. The processor 406 may be supported by the housing 404 via, for example, a PCB (see FIG. 5) attached to and/or supported by the housing 404. The processor 406 is in communication with other electrical devices or components of the computing device 400 via the PCB, for example. The computing device 400 may include a number of components not shown in FIG. 4 (e.g., a hard drive, a power supply, connectors).

The passive thermal management system 402 includes a phase change device 408. In the example shown in FIG. 4, the phase change device 408 is a vapor chamber. The passive thermal management system 402 of FIG. 4 is different than the example shown in FIGS. 2 and 3 in that the passive thermal management system 402 does not include an additional phase change device (e.g., a heat pipe). The vapor chamber 408 abuts or is adjacent to the processor 406. The passive thermal management system 402 may be installed in a computing device where heat flux within the computing device does not reach levels high enough to prevent a working fluid (e.g., water) within the vapor chamber 408 to return to a heat source (e.g., dry-out) such as, for example, the processor 406 (e.g., an evaporator).

The vapor chamber 408 may be any number of sizes and/or shapes. For example, as shown in FIG. 4, the vapor chamber 408 may be a rectangular flat vapor chamber (e.g., with rounder corners). The thickness of the vapor chamber 408 may be defined based on the thickness of the computing device 400 in which the passive thermal management system 402 is installed. A largest outer surface area of the vapor chamber 408 may approximately match a surface area (e.g., a largest surface area) of an inner surface 410 of the housing 404. In one example, the vapor chamber 408 is sized such that the largest outer surface area of the vapor chamber 408 is as large as will fit inside the housing 404. In other examples, the vapor chamber 408 is smaller (see FIG. 1).

At least one layer of phase change material 412 (e.g., refined paraffin wax with a binder) is disposed on an outer surface of the vapor chamber 408. In the example shown in FIG. 4, two layers of phase change material 412 (e.g., a first layer of phase change material 412a and a second layer of phase change material 412b) are disposed on the vapor chamber 408. One or more properties (e.g., latent heat of fusion) of the first layer of phase change material 412a and the second layer of phase change material 412b, respectively, are different. The first layer of phase change material 412a and the second layer of phase change material 412b may have different or the same sizes and/or shapes. In other examples, more or fewer layers of phase change material are disposed on the vapor chamber 408.

Figure 5:
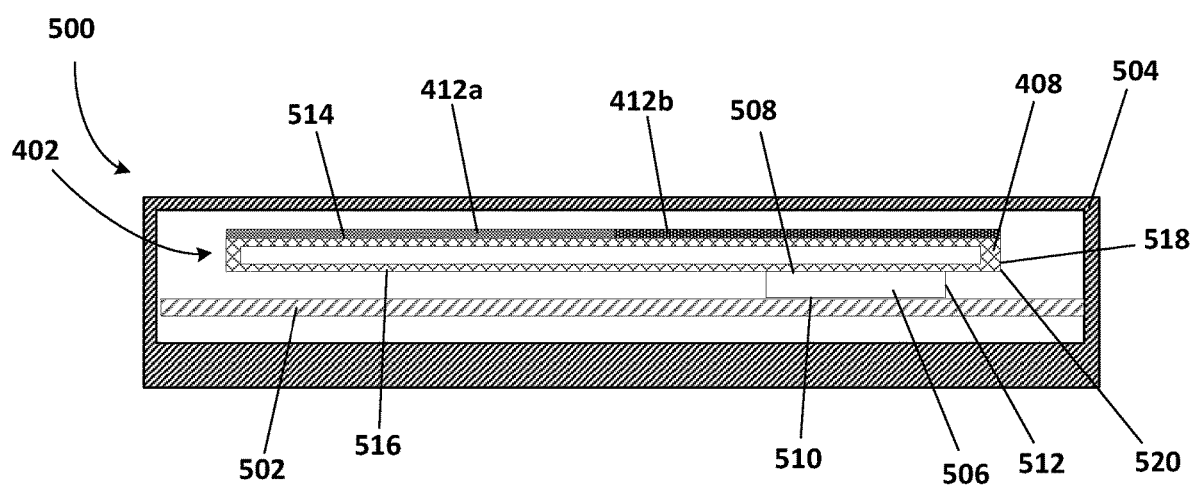
FIG. 5 depicts a cross section of a computing device including the passive thermal management system of FIG. 4.

FIG. 5 depicts a cross section of a computing device 500 including the passive thermal management system 402 of FIG. 4. The computing device 500 also includes a PCB 502 supported within a housing 504. The PCB 502 may be supported by and/or fixed to the housing 504 in any number of ways including, for example, with tabs, flanges, connectors, an adhesive, or any combination thereof. The PCB 502 supports and is electrically connected to a heat generating component 506 (e.g., a processor).

Heat is moved away from the processor 506, for example, and out of the computing device 500 with the passive thermal management system 402. The processor 506 includes a first side 508 (e.g., a top or first surface), a second side 510 (e.g., a bottom or a second surface), and at least one third side 512 that extends from the first side 508 to the second side 510. The second side 510 of the processor 506 abuts or is adjacent to the PCB 502. The first side 508 of the processor 506 abuts or is adjacent to the vapor chamber 408 of the passive thermal management system 402.

The vapor chamber 408 includes a first side 514 (e.g., a top), a second side 516 (e.g., a bottom), and at least one third side 518 that extends from the first side 514 to the second side 516. The second side 516 of the vapor chamber 408 abuts or is adjacent to the first side 508 of the processor 506. The second side 516 of the vapor chamber 408 may be adjacent to the first side 508 of the processor 506 in that one or more layers of additional material may be disposed between the second side 516 of the vapor chamber 408 and the first side 508 of the processor 506. For example, one or more layers of thermal adhesive may be disposed between the second side 516 of the vapor chamber 408 and the first side 508 of the processor 506. The first side 514 of the vapor chamber 408 abuts or is adjacent to a surface of the housing 504. The vapor chamber 408 may be physically attached to the PCB 502, the housing 504, another surface within the computing device 500, or any combination thereof in any number of ways including, for example, with tabs, flanges, connectors, an adhesive, or any combination thereof.

One or more layers of phase change material 412 are positioned on at least a portion of an outer surface 520 of the vapor chamber 408. In the example shown in FIG. 5, two separate layers of phase change material 412 (e.g., a first layer of phase change material 412a and a second layer of phase change material 412b) are disposed on respective portions of the outer surface 520 of the vapor chamber 408. More, fewer, or different layers of phase change material 412 may be applied to the vapor chamber 408 or other components of the computing device 500, for example. In the example shown in FIG. 5, the materials of the first layer of phase change material 412a and the second layer of phase change material 412b are different. In other examples, more or fewer different types of materials may be used.

Figure 6:
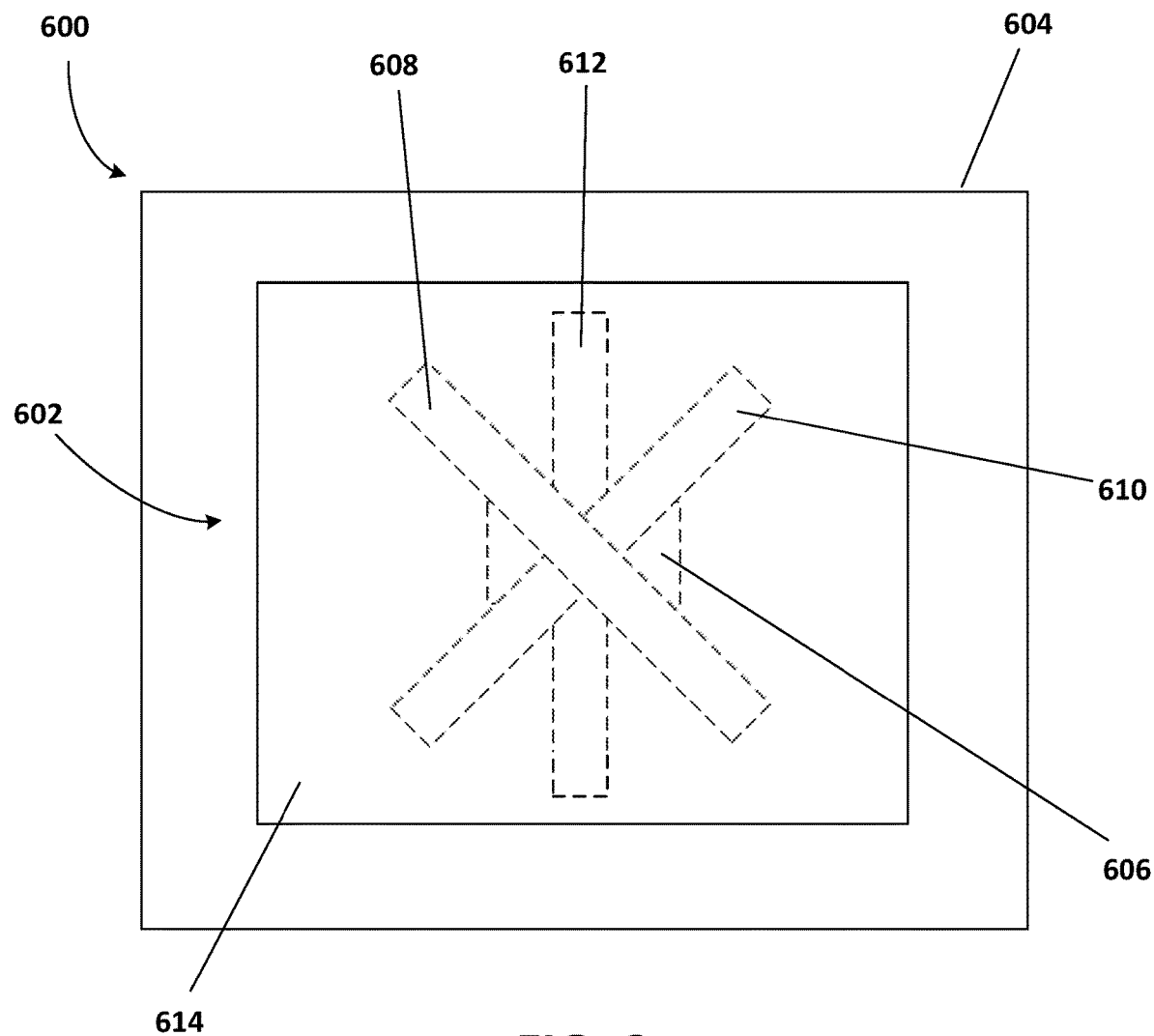
FIG. 6 depicts a top view of a portion of a computing device including yet another example of a passive thermal management system.

FIG. 6 depicts a top view of a portion of a computing device 600 including yet another example of a passive thermal management system 602 supported by a housing 604. In FIG. 6, a portion of the housing 604 is removed, and an interior of the housing 604 (e.g., largest cross-section of the housing) is shown. The computing device 600 also includes a heat generating component 606 (e.g., a processor) supported within the housing 604. The passive thermal management system 602 is physically and thermally connected to the processor 606, for example. The processor 606 may be supported by the housing 604 via, for example, a PCB attached to and/or supported by the housing 604. The computing device 600 may include a number of components not shown in FIG. 6 (e.g., a hard drive, a power supply, connectors).

In the example shown in FIG. 6, the passive thermal management system 602 includes a first phase change device 608, a second phase change device 610, a third phase change device 612, and a heat spreader 614. In the example shown in FIG. 6, the first phase change device 608, the second phase change device 610, and the third phase change device 612 are heat pipes, and the heat spreader 614 is a solid piece of thermally conductive material. For example, the heat spreader 614 may be made of a thermally conductive metal such as copper or graphite.

A layer of phase change material is disposed on at least a portion of an outer surface of the heat spreader 614 (e.g., a top, or a top and a bottom of the heat spreader 614). The phase change material may be any number of materials. For example, the phase change material is a refined paraffin wax that includes a binder. Different paraffin waxes may be used for different layers of phase change material applied to the outer surface of the heat spreader 614 based on the locations of different temperatures produced within the particular computing device. In other examples, layers of phase change material may be disposed on at least one of the heat pipes 608, 610, 612 and/or other surfaces instead of or in addition to the heat spreader 614.

The first heat pipe 608, the second heat pipe 610, and the third heat pipe 612 may be any number of sizes and/or shapes including, for example, flat heat pipes with approximately rectangular cross sections. The heat spreader 614 may also be any number of sizes and/or shapes. For example, the heat spreader 614 may be rectangular in shape and may be sized to approximately match a largest cross section of the computing device 600, for example.

The first heat pipe 608, the second heat pipe 610, and the third heat pipe 612 may be stacked one on another. For example, each heat pipe of the first heat pipe 608, the second heat pipe 610, and the third phase heat pipe 612 has a first side (e.g., a top or a first surface), a second side (e.g., a bottom or a second surface), and at least one third side that extends from the first side to the second side. The second side of the first heat pipe 608 abuts or is adjacent to a portion of the first side of the second heat pipe 610, and the second side of the second heat pipe 610 abuts or is adjacent to a portion of the first side of the third heat pipe 612. The first heat pipe 608 may be adjacent to the second heat pipe 610, and the second heat pipe 610 may be adjacent to the third heat pipe 612 in that layers of thermally conductive material such as, for example, a thermal adhesive may be disposed between the adjacent heat pipes.

The first heat pipe 608 has a first length, the second heat pipe 610 has a second length, and the third heat pipe 612 has a third length. The first heat pipe 608 extends in a first lengthwise direction orientation, the second heat pipe 610 extends in a second lengthwise direction orientation, and the third heat pipe 612 extends in a third lengthwise direction orientation. For example, the first lengthwise direction orientation may be perpendicular to the second lengthwise direction orientation, and the first lengthwise direction orientation may be rotated 45 degrees relative to the third lengthwise direction orientation. In another example, the second heat pipe 610 is rotated 60 degrees relative to the first heat pipe 608, and the third heat pipe 612 is rotated 60 degrees relative to the second heat pipe 610. The angular spacing of the first heat pipe 608, the second heat pipe 610, and the third heat pipe 612 may aid in the spreading of the heat generated by the processor 606, for example.

Other configurations may be provided. For example, more or fewer heat pipes may be provided. As another example, the first phase change device 608, the second phase change device 610, and the third phase change device 612 may be parts of a single heat pipe or vapor chamber. For example, such a single heat pipe may include a central portion and three or more extensions extending away from the central portion longitudinally in coplanar directions. In one example, the heat spreader 614 may be a vapor chamber.

Figure 7:
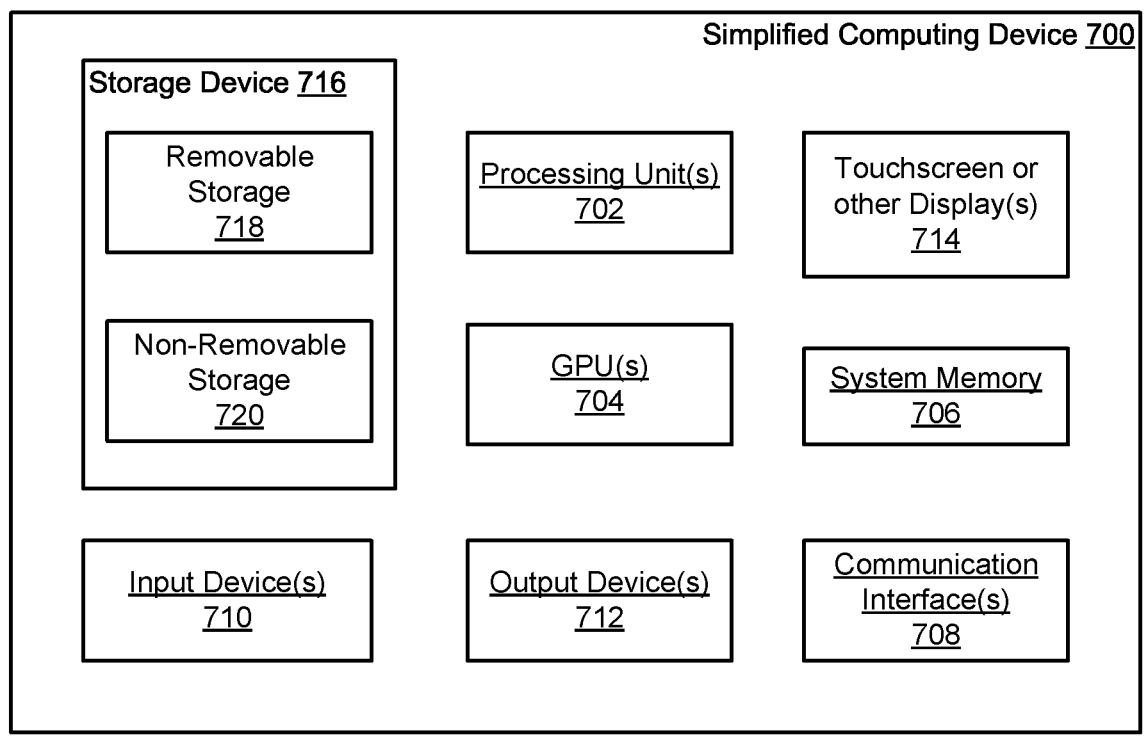
FIG. 7 is a block diagram of a computing environment in accordance with one example for implementation of the disclosed methods or one or more electronic devices.

With reference to FIG. 7, a thermal management system, as described above, may be incorporated within an exemplary computing environment 700. The computing environment 700 may correspond with one of a wide variety of computing devices, including, but not limited to, personal computers (PCs), server computers, tablet and other hand-held computing devices, laptop or mobile computers, communications devices such as mobile phones, multiprocessor systems, microprocessor-based systems, set top boxes, programmable consumer electronics, network PCs, minicomputers, mainframe computers, or audio or video media players. For example, the heat dissipating apparatus is incorporated within a computing environment having an active cooling source (e.g., fan).

The computing environment 700 has sufficient computational capability and system memory to enable basic computational operations. In this example, the computing environment 700 includes one or more processing units 702, which may be individually or collectively referred to herein as a processor. The computing environment 700 may also include one or more graphics processing units (GPUs) 704. The processor 702 and/or the GPU 704 may include integrated memory and/or be in communication with system memory 706. The processor 702 and/or the GPU 704 may be a specialized microprocessor, such as a digital signal processor (DSP), a very long instruction word (VLIW) processor, or other microcontroller, or may be a general purpose central processing unit (CPU) having one or more processing cores. The processor 702, the GPU 704, the system memory 706, and/or any other components of the computing environment 700 may be packaged or otherwise integrated as a system on a chip (SoC), application-specific integrated circuit (ASIC), or other integrated circuit or system.

The computing environment 700 may also include other components, such as, for example, a communications interface 708. One or more computer input devices 710 (e.g., pointing devices, keyboards, audio input devices, video input devices, haptic input devices, or devices for receiving wired or wireless data transmissions) may be provided. The input devices 710 may include one or more touch-sensitive surfaces, such as track pads. Various output devices 712, including touchscreen or touch-sensitive display(s) 714, may also be provided. The output devices 712 may include a variety of different audio output devices, video output devices, and/or devices for transmitting wired or wireless data transmissions.

The computing environment 700 may also include a variety of computer readable media for storage of information such as computer-readable or computer-executable instructions, data structures, program modules, or other data. Computer readable media may be any available media accessible via storage devices 716 and includes both volatile and nonvolatile media, whether in removable storage 718 and/or non-removable storage 720. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by the processing units of the computing environment 700.

Figure 8:
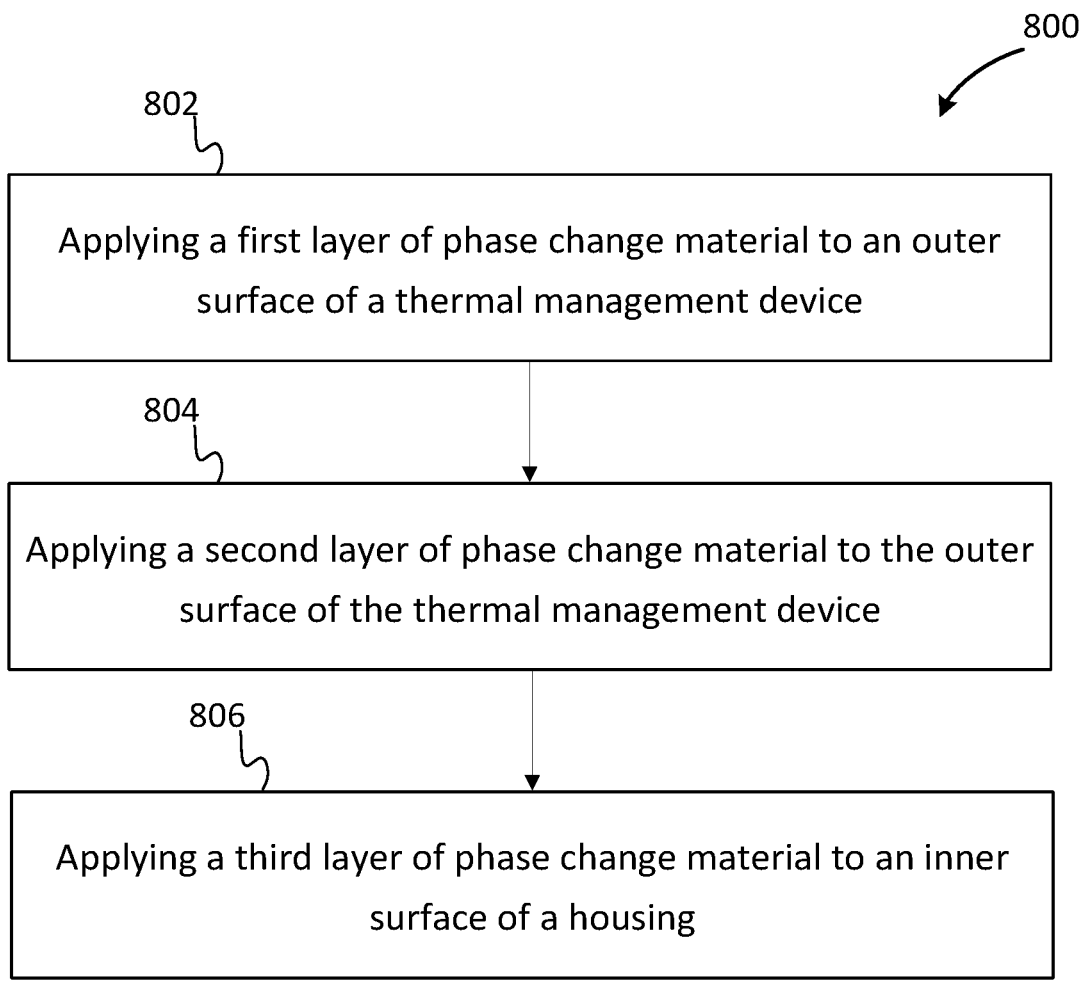
FIG. 8 is a flow diagram of a method for manufacturing a computing device in accordance with one example.

FIG. 8 shows a flowchart of one example of a method 800 for manufacturing a computing device. The computing device may be a computing device shown in FIGS. 1-7 or may be another computing device. The method 800 is implemented in the order shown, but other orders may be used. Additional, different, or fewer acts may be provided. Similar methods may be used for transferring heat.

In act 802, a first layer of phase change material is applied to an outer surface of a thermal management device disposed in the computing device. The thermal management device may be any number of thermal management devices including, for example, a phase change device, a heat spreader, a heat sink, a fan housing, or another thermal management device. For example, the thermal management device is a heat spreader or a phase change device (e.g., a vapor chamber) of a passive thermal management system.

The first layer of phase change material may be applied to the outer surface of the thermal management device with the phase change material in a melted state. The first layer of phase change material may be applied to the thermal management device with a single application or a number of separate applications. For example, the thickness of the first layer of phase change material may be built up with a plurality of applications of the phase change material, one on top of the other, on the outer surface of the thermal management device. The first layer of phase change material may be a refined paraffin wax with a binder. Other phase change materials may be used.

The first layer of phase change material may cover the entire outer surface of the thermal management device. Alternatively, the first layer of phase change material may cover only a portion of the outer surface of the thermal management device. The portion of the outer surface of the thermal management device may be a portion (e.g., a side) that faces a portion of a housing of the computing device that is to be cooled (e.g., a side of the housing that is to be isothermal).

In act 804, a second layer of phase change material is applied to the outer surface of the thermal management device. The second layer of phase change material may be applied to the outer surface of the thermal management device with the phase change material in a melted state. The second layer of phase change material may be applied to the thermal management device with a single application or a number of separate applications. For example, the thickness of the second layer of phase change material may be built up with a plurality of applications of the phase change material, one on top of the other, on the outer surface of the thermal management device.

The second layer of phase change material may be a refined paraffin wax with a binder. Other phase change materials may be used. In one example, the second layer of phase change material is made of the same material as the first layer of phase change material. In another example, the first layer of phase change material is made of a first material, and the second layer of phase change material is made of a second material. The first material and the second material are different and have different properties. For example, the first material and the second material have different melt temperatures, different latent heats of fusion, different densities, different other properties, or any combination thereof.

The second layer of phase change material may cover the entire outer surface of the thermal management device.

Alternatively, the second layer of phase change material may cover only a portion of the outer surface of the thermal management device. The portion of the outer surface of the thermal management device may be a portion (e.g., a side) that faces the portion of a housing of the computing device that is to be cooled. The second layer of phase change material may be applied, at least partially, on the first layer of phase change material. Alternatively or additionally, the second layer of phase change material may be applied to the outer surface of the thermal management device, next to the first layer of phase change material.

Additional or fewer layers of phase change material may be applied to the thermal management device or other components within the computing device. For example, only a single layer of phase change material may be applied to the thermal management device. As another example, more than two layers of phase change material are applied to the thermal management device. Different layers of varying size, thickness, type of phase change material, or any combination thereof may be applied to the thermal management device based on a temperature profile within the computing device during operation of the computing device (e.g., at steady state power and/or greater than steady state power). The different layers of phase change material may provide an isothermal surface on the housing of the computing device.

In act 806, a third layer of phase change material is optionally applied to an inner surface of the housing of the computing device. The third layer of phase change material may be applied to the inner surface of the housing of the computing device in a melted state. The third layer of phase change material may be applied to the housing with a single application or a number of separate applications. For example, the thickness of the third layer of phase change material may be built up with a plurality of applications of the phase change material, one on top of the other, on the inner surface of the housing.

The third layer of phase change material may be a refined paraffin wax with a binder. Other phase change materials may be used. In one example, the third layer of phase change material is made of the same material as the first layer of phase change material and/or the second layer of phase change material. In another example, the third layer of phase change material is made of a third material, which is different than the first material and the second material. The third material may have different properties than the first material and/or the second material. For example, the first material, the second material, and the third material have different melt temperatures, different latent heats of fusion, different densities, different other properties, or any combination thereof.

The third layer of phase change material may cover the entire inner surface of the thermal management device. Alternatively, the third layer of phase change material may cover only a portion of the inner surface of the thermal management device (e.g., the portion of the inner surface of the housing facing the thermal management device). Like the thermal management device, more than one layer of phase change material may be applied to the inner surface of the computing device based on temperatures produced within the computing device.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a computing device includes a heat generating component and a heat spreader physically connected to the heat generating component. The heat spreader includes a first surface and a second surface. The second surface is closer to the heat generating component than the first surface is to the heat generating component. The computing device also includes a layer of phase change material on at least a portion of the first surface, the second surface, or the first surface and the second surface of the heat spreader.

In a second embodiment, with reference to the first embodiment, the heat spreader includes a phase change device.

In a third embodiment, with reference to the first embodiment, the heat spreader includes a solid piece of thermally conductive material.

In a fourth embodiment, with reference to the first embodiment, the computing device further includes a phase change device positioned between the heat generating component and the heat spreader. The phase change device includes a first surface and a second surface. The first surface of the phase change device is physically connected to the heat spreader, and the second surface of the phase change device is physically connected to the heat generating device.

In a fifth embodiment, with reference to the fourth embodiment, the heat spreader includes a vapor chamber, and the phase change device includes a heat pipe.

In a sixth embodiment, with reference to the first embodiment, the layer of phase change material covers the entire first surface of the heat spreader.

In a seventh embodiment, with reference to the first embodiment, the layer of phase change material includes a layer of paraffin wax including a binder.

In an eighth embodiment, with reference to the first embodiment, the layer of phase change material is a first layer of phase change material. The computing device further includes a second layer of phase change material. The first layer of phase change material is made of a different material than the second layer of phase change material.

In a ninth embodiment, with reference to the eighth embodiment, the first layer of phase change material and the second layer of phase change material have different melting temperatures, different latent heats of fusion, different densities, or any combination thereof.

In a tenth embodiment, with reference to the first embodiment, the layer of phase change material is a first layer of phase change material. The computing device further includes a second layer of phase change material. The second layer of phase change material covers at least a portion of the second surface of the heat spreader.

In an eleventh embodiment, with reference to the first embodiment, the computing device further includes a housing, by which the heat generating component is supported. The housing includes an inner surface. The layer of phase change material is at a distance from the surface of the housing.

In a twelfth embodiment, a computing device includes a housing, a heat generating component supported by the housing, and a heat pipe. The heat pipe includes a first surface and a second surface. The second surface of the heat pipe abuts or is adjacent to the heat generating component. The computing device also includes a heat spreader. The heat spreader includes a first surface and a second surface. The heat spreader is physically connected to the heat pipe, and the second surface of the heat spreader is closer to the first surface of the heat pipe than the first surface of the heat spreader is to the first surface of the heat pipe. The computing device also includes a layer of phase change material covering at least a portion of the first surface of the heat spreader.

In a thirteenth embodiment, with reference to the twelfth embodiment, the heat generating component includes a processor.

In a fourteenth embodiment, with reference to the twelfth embodiment, the heat spreader includes a solid piece of metal or graphite.

In a fifteenth embodiment, with reference to the twelfth embodiment, the heat pipe is a first heat pipe. The computing device further includes at least a second heat pipe. The second heat pipe includes a first surface and a second surface. The second surface of the second heat pipe abuts or is adjacent to a portion of the first surface of the first heat pipe, and the first surface of the second heat pipe abuts or is adjacent to the second surface of the heat spreader.

In a sixteenth embodiment, with reference to the fifteenth embodiment, the first heat pipe has a length and extends in a first lengthwise direction orientation. The second heat pipe has a length and extends in a second lengthwise direction orientation. The first lengthwise direction orientation is different than the second lengthwise direction orientation.

In a seventeenth embodiment, with reference to the twelfth embodiment, the heat pipe includes a central portion and three or more extensions extending away from the central portion longitudinally in coplanar directions.

In an eighteenth embodiment, with reference to the twelfth embodiment, the layer of phase change material covers the entire first surface of the heat spreader. The layer of phase change material includes a layer of paraffin wax.

In a nineteenth embodiment, a thermal management device includes a phase change device and a heat spreader physically attached to the phase change device. The heat spreader includes a first surface and a second surface. The second surface of the heat spreader is closer to the phase change device than the first surface of the heat spreader is to the phase change device. The thermal management device also includes a first layer of phase change material covering a first portion of the first surface of the heat spreader. The thermal management device also includes a second layer of phase change material covering a second portion of the first surface of the heat spreader. The first layer of phase change material is a different size than the second layer of phase change material. The first layer of phase change material is made of a different material than the second layer of phase change material, or a combination thereof.

In a twentieth embodiment, with reference to the nineteenth embodiment, the first layer of phase change material and the second layer of phase change material have different melting temperatures.

In connection with any one of the aforementioned embodiments, the thermal management device or the method for manufacturing the thermal management device may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:

1. A computing device comprising:
   a heat generating component;
   a heat spreader physically connected to the heat generating component, the heat spreader comprising a first outer surface and a second outer surface, the second outer surface being closer to the heat generating component than the first outer surface is to the heat generating component;
   a first layer of phase change material directly on at least a first portion of the first outer surface, the second outer surface, or the first outer surface and the second outer surface of the heat spreader; and
   a second layer of phase change material directly on at least a second portion of the first outer surface of the heat spreader such that the first layer and second layer are laterally adjacent to one another, wherein the first layer of phase change material and the second layer of phase change material have different melting temperatures, different latent heats of fusion, different densities, or any combination thereof.

2. The computing device of claim 1, wherein the heat spreader comprises a phase change device.

3. The computing device of claim 1, wherein the heat spreader comprises a solid piece of thermally conductive material.

4. The computing device of claim 1, further comprising a phase change device positioned between the heat generating component and the heat spreader, the phase change device comprising a first surface and a second surface, the first surface of the phase change device being physically connected to the heat spreader and the second surface of the phase change device being physically connected to the heat generating device.

5. The computing device of claim 4, wherein the heat spreader comprises a vapor chamber, and the phase change device comprises a heat pipe.

6. The computing device of claim 1, wherein the second layer of phase change material is applied to at least a portion of the first layer.

7. The computing device of claim 1, wherein the first layer of phase change material comprises a layer of paraffin wax including a binder.

8. The computing device of claim 1, wherein the first portion of the first outer surface is larger than the second portion of the first outer surface.

9. The computing device of claim 1, wherein the first layer of phase change material contacts the first outer surface and a second outer surface of the heat spreader.

10. The computing device of claim 1,
    wherein the computing device further comprises a third layer of phase change material, and
    wherein the third layer of phase change material covers at least a portion of the second outer surface of the heat spreader.

11. The computing device of claim 1, wherein the computing device further comprises a housing, by which the heat generating component is supported, the housing comprising an inner surface, and wherein the layer of phase change material is opposite and at a distance from the inner surface of the housing.

12. A computing device comprising:
    a housing;
    a heat generating component supported by the housing;

a heat pipe comprising a first surface and a second surface, the second surface of the heat pipe abutting or being adjacent to the heat generating component;

a heat spreader comprising a first outer surface and a second outer surface, the heat spreader being physically connected to the heat pipe and the second outer surface of the heat spreader being closer to the first surface of the heat pipe than the first outer surface of the heat spreader is to the first surface of the heat pipe; and a first layer of phase change material directly on at least a first portion of the first outer surface of the heat spreader; and a second layer of phase change material directly on at least a second portion of the first outer surface of the heat spreader.

13. The computing device of claim 12, wherein the heat generating component comprises a processor.

14. The computing device of claim 12, wherein the heat spreader comprises a solid piece of metal or graphite.

15. The computing device of claim 12, wherein the heat pipe is a first heat pipe, wherein the computing device further comprises at least a second heat pipe, the second heat pipe comprising a first surface and a second surface, and wherein the second surface of the second heat pipe is physically connected to a portion of the first surface of the first heat pipe, and the first surface of the second heat pipe abuts or is adjacent to the second surface of the heat spreader.

16. The computing device of claim 15, wherein the first heat pipe has a length and extends in a first lengthwise direction orientation, and the second heat pipe has a length and extends in a second lengthwise direction orientation, the first lengthwise direction orientation being different than the second lengthwise direction orientation such that the first heat pipe and second heat pipe are oriented at an angle to one another.

17. The computing device of claim 12, wherein the heat pipe comprises a central portion and three or more extensions extending away from the central portion longitudinally in coplanar directions.

18. The computing device of claim 12, wherein the first layer of phase change material and second layer of phase change material covers the entire first outer surface of the heat spreader, and wherein the at least one of the first layer of phase change material and the second layer of phase change material comprises a layer of paraffin wax.

19. A thermal management device comprising:

a phase change device;

a heat spreader physically attached to the phase change device, the heat spreader comprising a first outer surface and a second outer surface, the second outer surface of the heat spreader being closer to the phase change device than the first outer surface of the heat spreader is to the phase change device;

a first layer of phase change material directly contacting a first portion of the first outer surface of the heat spreader; and a second layer of phase change material directly contacting a second portion of the first outer surface of the heat spreader, wherein the first layer of phase change material is a different size than the second layer of phase change material such that a size of the first portion contacted by the first layer is different from a size of the second portion, the first layer of phase change material is made of a different material than the second layer of phase change material, or a combination thereof.

20. The thermal management device of claim 19, wherein the first layer of phase change material and the second layer of phase change material have different melting temperatures.

* * * * *